(12) United States Patent
Yang et al.

(10) Patent No.: US 7,682,855 B2
(45) Date of Patent: Mar. 23, 2010

(54) FABRICATION METHOD OF SUBSTRATE-FREE LIGHT EMITTING DIODE

(75) Inventors: Chien-Cheng Yang, Taipei County (TW); Zhi-Cheng Hsiao, Changhua County (TW); Gen-Wen Hsieh, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 747 days.

(21) Appl. No.: 11/461,436

(22) Filed: Jul. 31, 2006

(65) Prior Publication Data
US 2007/0158639 A1    Jul. 12, 2007

(30) Foreign Application Priority Data
Jan. 11, 2006    (TW) .............................. 95101039 A

(51) Int. Cl.
*H01L 21/00*    (2006.01)
(52) U.S. Cl. .............................. 438/29; 438/39; 438/42; 438/22
(58) Field of Classification Search ............... 438/29, 438/39, 42, 22
See application file for complete search history.

(56) References Cited

U.S. PATENT DOCUMENTS

| | | | |
|---|---|---|---|
| 6,117,700 A | 9/2000 | Orita et al. | |
| 6,555,405 B2 | 4/2003 | Chen et al. | |
| 6,784,463 B2 * | 8/2004 | Camras et al. | 257/99 |
| 6,806,112 B1 * | 10/2004 | Horng et al. | 438/29 |
| 6,936,486 B2 * | 8/2005 | Cheng et al. | 438/22 |
| 2003/0085851 A1 | 5/2003 | Horng et al. | |
| 2004/0211972 A1 | 10/2004 | Du et al. | |
| 2005/0056865 A1 | 3/2005 | Tsuchiya et al. | |

* cited by examiner

*Primary Examiner*—Lynne A Gurley
*Assistant Examiner*—Samuel A Gebremariam
(74) *Attorney, Agent, or Firm*—Jianq Chyun IP Office

(57) ABSTRACT

A substrate-free light emitting diode (LED) including an epitaxy layer, a conductive supporting layer, and a first contact pad is provided. The epitaxy layer includes a first type doped semiconductor layer, a light emitting layer, and a second type doped semiconductor layer. The light emitting layer is disposed on the first type doped semiconductor layer, and a portion of the first type doped semiconductor layer is exposed. The second type doped semiconductor layer and the conductive supporting layer are sequentially disposed on the second type doped semiconductor layer. The first contact pad is disposed on the exposed first type doped semiconductor layer and electrically connected thereto. The first contact pad and the conductive supporting layer serving as an electrode are disposed on the same side of the epitaxy layer to avoid the light shielding effects of the electrode to improve the front light emitting efficiency of the LED.

15 Claims, 5 Drawing Sheets

FABRICATION METHOD OF SUBSTRATE-FREE LIGHT EMITTING DIODE

CROSS-REFERENCE TO RELATED APPLICATION

This application claims the priority benefit of Taiwan application serial no. 95101039, filed Jan. 11, 2006. All disclosure of the Taiwan application is incorporated herein by reference.

BACKGROUND OF THE INVENTION

1. Field of the Invention

The present invention relates to a light emitting diode (LED) and a fabrication method thereof, and more particularly, to a flexible light emitting diode with preferable front light emitting efficiency and a fabrication method thereof.

2. Description of Related Art

The LED is a semiconductor element that has been widely used in light emitting devices. Generally, the LED chip is made up of III-V group compound semiconductors, such as GaP, GaAs, and GaN. The light emitting principle is to convert electrical energy into light, that is, a current is applied to the compound semiconductor, and by combining electrons with holes, the energy is converted into light so as to achieve the light emitting effect. Since LEDs have the advantages of rapid response speed (generally within about $10^{-9}$ seconds), preferable monochromaticity, small volume, low electrical power consumption, low pollution (free of mercury), high reliability, applicability for mass production processes, etc., they are widely used, such as in traffic light signals, display panels, and display interfaces of various portable electronic devices, etc.

Basically, an LED comprises a p-type III-V group compound, an n-type III-V group compound, and a light emitting layer sandwiched there-between. Further, an LED is fabricated by means of epitaxy. The light emitting efficiency of an LED element mainly depends on the internal quantum efficiency of the light emitting layer and the light extraction efficiency of the element, i.e., the external quantum efficiency.

As a light source of the flexible display, the LED encounters the following challenges. (1) LED dies belong to hard and brittle materials, so the LED dies are not flexible. (2) When an LED is applied in a backlight module, the LED lamp is combined with a large size substrate. However, the heat dissipation of the LED is poor over long time usage, so the service life of the LED is thereby shortened. (3) Since the substrate, such as GaAs substrate, used by the LED itself may absorb light, the light emitting efficiency of LED is degraded. (4) Since an LED fabricated through the current process is a bit thick, displays employing such LEDs cannot be developed towards miniaturization.

In order to solve the problems of poor heat dissipation and low light emitting efficiency of the LED, various LED structures and fabrication methods are provided.

US Patent Publication No. 2003/0085851 discloses an LED and a fabrication method thereof. Referring to FIG. 1, as for the fabrication method of LED 10, an insulating specular reflection layer 14 is formed on the bottom of an epitaxy layer 13, and a metal adhesion layer 12 is formed on the top of a silicon substrate 11 corresponding to the epitaxy layer 13. The epitaxy layer 13 comprises an n-type interface 13A and a p-type interface 13B. Next, the epitaxy layer 13 is bonded onto the top of the silicon substrate 11 through the specular reflection layer 14 and the metal adhesion layer 12 by means of hot pressing, and a temporary substrate (not shown) used for epitaxy is removed. Subsequently, an n-type ohmic contact electrode 15 and a p-type ohmic contact electrode 16 are respectively formed on the n-type interface 13A and the p-type interface 13B through coating and etching processes. Thereby, the LED 10 is fabricated.

As for LED 10 shown in FIG. 1, the light reflection efficiency is mainly improved through configuring the specular reflection layer 14, thereby improving the light emitting efficiency, and also the high heat conductivity of the silicon substrate 11 is used to improve the heat dissipation effect. However, since the n-type ohmic contact electrode 15 and the p-type ohmic contact electrode 16 are disposed on the light emitting surface of LED 10, the emission of the light may be affected, thereby the light emitting efficiency is degraded. Furthermore, since the silicon substrate 11 has a certain thickness, the fabricated LED 10 cannot meet the requirements of miniaturization.

Furthermore, U.S. Pat. No. 6,555,405 discloses a semiconductor element with a metal substrate. FIGS. 2A and 2B are cross-sectional views of the manufacturing flow of the semiconductor element with a metal substrate. First, referring to FIG. 2A, a substrate 21 is provided, and an n-type semiconductor layer 22, a light emitting layer 23, and a p-type semiconductor layer 24 are sequentially grown thereon. After the epitaxy process, a thick metal substrate 25 is then formed on the p-type semiconductor layer 24. Next, referring to FIG. 2B, the substrate 21 is removed by means of etching, polishing, etc., and the chip is reversed. And finally, a contact pad 26 is formed on the n-type semiconductor layer 22 to complete the fabrication of the LED 20.

The LED 20 shown in FIG. 2B is mainly characterized in that, the metal substrate 25 is used to replace the conventional semiconductor substrate, and the heat dissipation efficiency of the LED 20 is improved through the high heat conductivity and high electrical conductivity of the metal substrate 25, thereby improving the light output efficiency. However, since the contact pad 26 is disposed on the light emitting surface of the LED 20, the light emitting efficiency of the LED 20 is degraded. Additionally, the thickness of the current LED is about 120 μm to 200 μm, but it can still become thinner.

Although the above-mentioned two LEDs with different forms have partially solved the problems of heat dissipation and light emitting efficiency through different methods, the structures of the two LEDs still cannot overcome the problems of flexibility and miniaturization. Therefore, how to improve the efficiencies of heat dissipation and light emitting of the LED by changing the structure of the LED and meanwhile achieving the purposes of flexibility and miniaturization is a vital issue to be solved.

SUMMARY OF THE INVENTION

One object of the present invention is to provide a method for fabricating a substrate-free light emitting diode (LED). In the substrate-free LED fabricated through this method, a first contact and a conductive supporting layer serving as an electrode are both disposed on the same side of an epitaxy layer, such that the light shielding effect of the electrode may be avoided. Thus, the front light emitting efficiency of the LED may be improved. Furthermore, as for the substrate-free LED provided by the present invention, a thick metal film is employed to serve as both an electrode and an element to support the epitaxy layer, such that the fabricated LED is flexible due to the ductility of the metal. Furthermore, since the LED has no substrate, the whole LED can meet the requirements of miniaturization.

Another object of the present invention is to provide a substrate-free LED. In the substrate-free LED, the thick metal film used for supporting the epitaxy layer has high reflexivity and high heat conductivity, so as to improve the front light emitting efficiency of the LED and to solve the problem of heat dissipation when the LED is combined with a large size substrate.

In order to achieve the above or other objects, the present invention provides a method for fabricating such a substrate-free LED, which comprises the following steps. First, a template substrate is provided and then an epitaxy layer is formed on the template substrate, wherein the epitaxy layer includes a first type doped semiconductor layer, a light emitting layer, and a second type doped semiconductor layer sequentially stacked thereon. Next, a metal layer is formed on the epitaxy layer and then the above template substrate is removed. Next, portions of the metal layer, the second type doped semiconductor layer and the light emitting layer are removed to expose a portion of the first type doped semiconductor layer, wherein the remaining metal layer forms a conductive supporting layer. Finally, a first contact pad is formed on the exposed first type doped semiconductor layer, wherein the first contact is electrically connected to the first type doped semiconductor layer.

In one embodiment of the present invention, a material of the template substrate includes one of silicon, glass, GaAs, GaN, AlGaAs, GaP, SiC, InP, BN, $Al_2O_3$, sapphire and AlN.

In one embodiment of the present invention, the step for forming the first type doped semiconductor layer on the template substrate includes forming a first contact layer on the template substrate and then forming a first cladding layer on the first contact layer.

In one embodiment of the present invention, the light emitting layer comprises a Multiple Quantum Well (MQW) structure.

In one embodiment of the present invention, the step for forming the second type doped semiconductor layer includes forming a second cladding layer on the light emitting layer and then forming a second contact layer on the second cladding layer.

In one embodiment of the present invention, the first type doped semiconductor layer and the second type doped semiconductor layer are an n-type semiconductor layer and a p-type semiconductor layer respectively.

In one embodiment of the present invention, the metal layer is formed through a plating process. Furthermore, the plating process particularly includes evaporation, sputtering, electroplating, or electroless-plating. When the above metal layer is formed by means of electroplating, first an electroplating seed layer is formed on the second type doped semiconductor layer, and then the metal layer is formed by means of electroplating.

In one embodiment of the present invention, the method for removing the above template substrate includes a dry etching process, a wet etching process, a polishing process, or a lift-off process.

In one embodiment of the present invention, the process of removing the template substrate includes grinding and then polishing the template substrate.

In one embodiment of the present invention, the method for removing a part of the metal layer, the second type doped semiconductor layer, and the light emitting layer includes a dry etching process or a wet etching process.

In one embodiment of the present invention, the step for removing portions of the metal layer, the second type doped semiconductor layer, and the light emitting layer further comprise removing a portion of the first type doped semiconductor layer to expose a portion of the first type doped semiconductor layer. The step for removing portions of the metal layer, the second type doped semiconductor layer, the light emitting layer, and the first type doped semiconductor layer includes a dry etching process or a wet etching process.

In one embodiment of the present invention, the method for fabricating the substrate-free LED further comprises forming a second contact pad on the conductive supporting layer, wherein the second contact pad is electrically connected to the conductive supporting layer.

In order to achieve the above or other objects, the present invention further provides a substrate-free light emitting diode (LED), which comprises an epitaxy layer, a conductive supporting layer, and a first contact pad. The epitaxy layer comprises a first type doped semiconductor layer, a light emitting layer, and a second type doped semiconductor layer. The light emitting layer is disposed on the first type doped semiconductor layer and exposes a portion of the first type doped semiconductor layer. The second type doped semiconductor layer is disposed on the light emitting layer. The conductive supporting layer is disposed on the second type doped semiconductor layer. The first contact pad is disposed on the first typed doped semiconductor layer exposed by the light emitting layer and electrically connected thereto.

In one embodiment of the present invention, the first type doped semiconductor layer and the second type doped semiconductor layer are an n-type semiconductor layer and a p-type semiconductor layer respectively.

In one embodiment of the present invention, the first type doped semiconductor layer comprises a first contact layer and a first cladding layer, wherein the first cladding layer is disposed on the first contact layer.

In one embodiment of the present invention, the light emitting layer comprises a Multiple Quantum Well (MQW) structure.

In one embodiment of the present invention, the second type doped semiconductor layer comprises a second cladding layer and a second contact layer, wherein the second cladding layer is disposed on the light emitting layer; and the second contact layer is disposed on the second cladding layer.

In one embodiment of the present invention, a material of the conductive supporting layer is selected from a group consisting of copper, nickel, gold, palladium, platinum, and alloys thereof.

In one embodiment of the present invention, the substrate-free LED further comprises a second contact pad, wherein the second contact pad is disposed on the conductive supporting layer and electrically connected thereto.

In one embodiment of the present invention, the total thickness of the substrate-free is between 11 μm and 120 μm.

In view of the above, in the method for fabricating the substrate-free LED provided by the present invention, first, an epitaxy layer and a thick metal film are formed on a template substrate in sequence and then the template substrate is removed. Next, portions of the metal layer, the second type doped semiconductor layer and the light emitting layer in the epitaxy layer are removed to expose a portion of the first type doped semiconductor layer. Finally, a first contact pad is formed on the exposed first type doped semiconductor layer. Thus, the substrate-free LED is fabricated. Since the metal layer on the second type doped semiconductor layer can serve as an electrode, and the metal layer and the first contact pad are disposed on the same side of the epitaxy layer, the light shielding effect of the electrode can be avoided, so as to improve the front light emitting efficiency of the LED.

Additionally, the metal layer disposed on one side of the epitaxy layer not only serves as an electrode, but also supports the epitaxy layer. Therefore, the LED formed using the method of the present invention is flexible due to the favorable ductility of the metal material. As such, the LED provided by the present invention can be applied to flexible displays. Furthermore, since the metal has preferable heat conductivity, through configuring the metal layer, the problem of heat dissipation when the LED is combined with a large size substrate can be improved.

In order to make aforementioned and other objects, features, and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 3A-3F are cross-sectional views of the process of a substrate-free light emitting diode (LED) according to one preferred embodiment of the present invention. First, referring to FIG. 3A, a template substrate 110 is provided. Since the template substrate 110 will be removed once the desired element has been fabricated, all substrates that can grow a favorable epitaxy layer structure can serve as the template substrate 110. The material employed by the template substrate 110 includes semiconductor or non-semiconductor materials, such as, Si, glass, GaAs, GaN, AlGaAs, GaP, SiC, InP, BN, $Al_2O_3$, sapphire or AlN.

Figure 1:
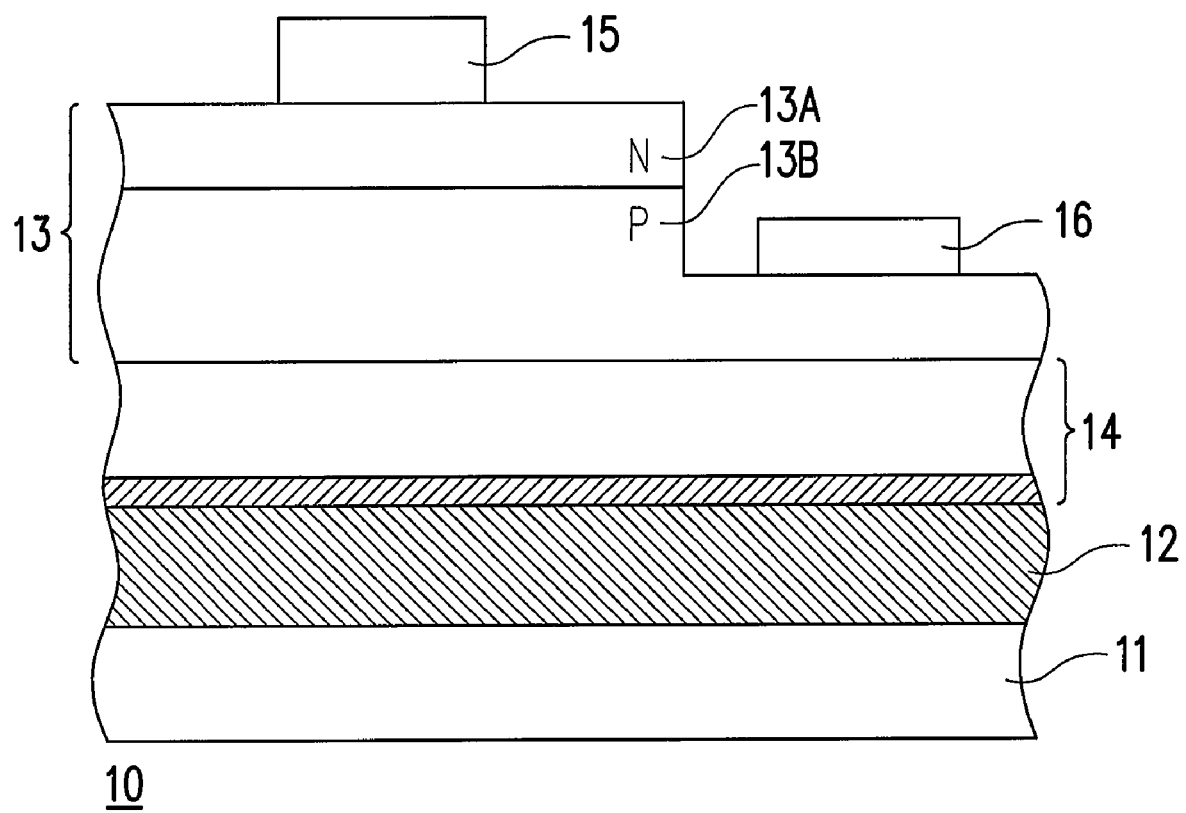
FIG. 1 is a schematic cross-sectional view of a conventional LED.
Figure 2A:
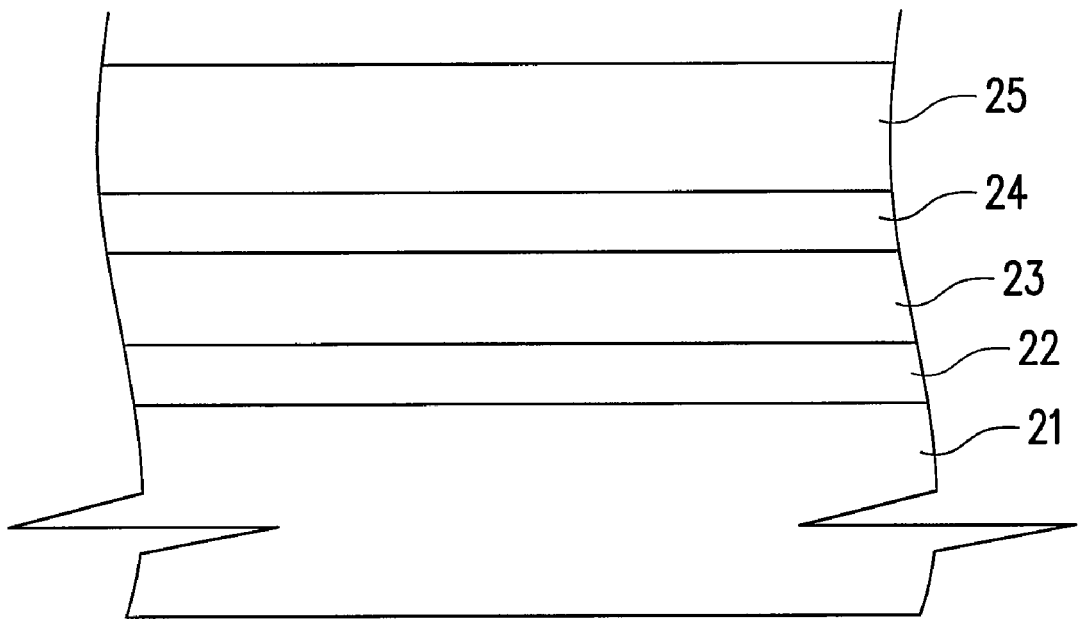
FIGS. 2A and 2B are cross-sectional views illustrating the process of a conventional semiconductor element with a metal substrate.
Figure 2B:
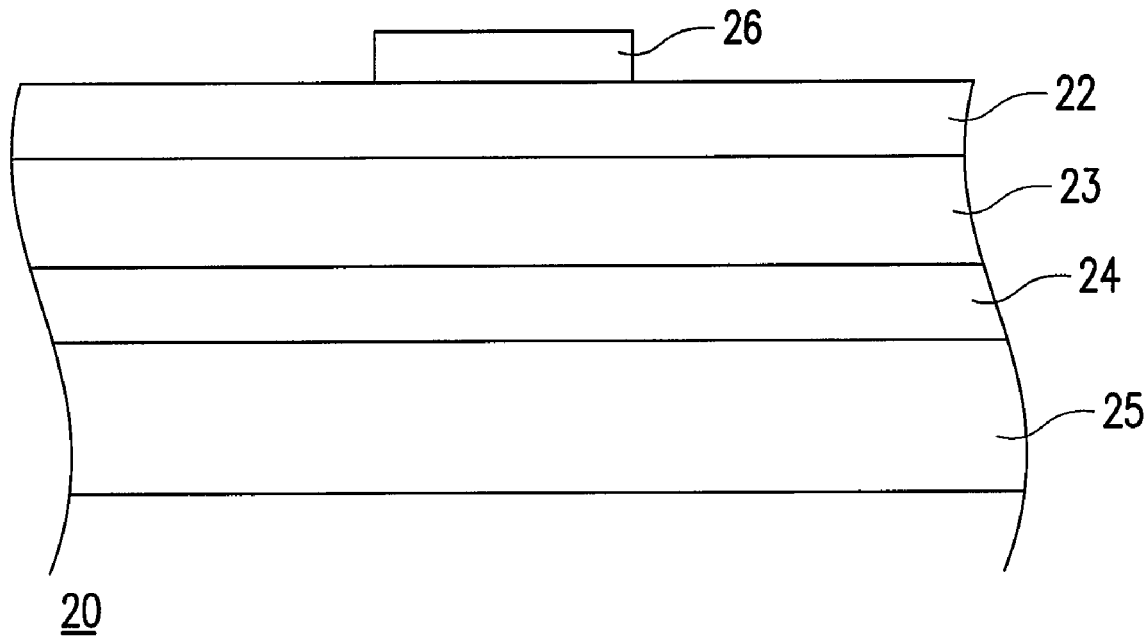
Figure 3A:
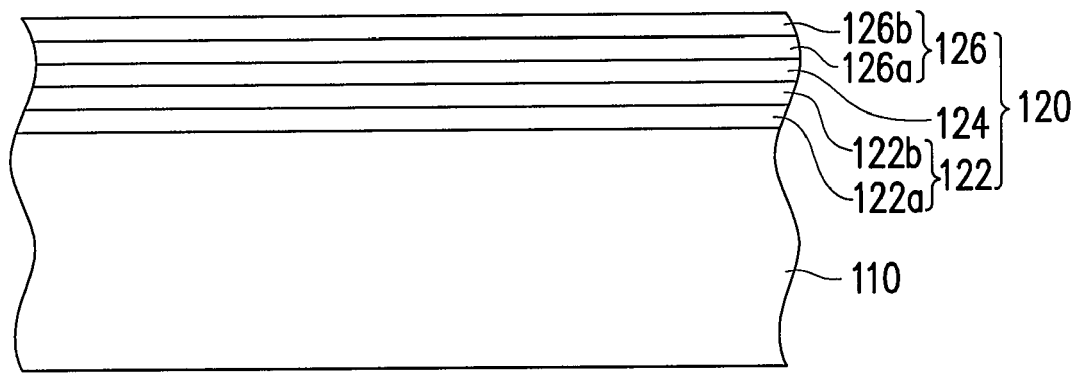
FIGS. 3A-3F are cross-sectional views illustrating the process of the LED according to one preferred embodiment of the present invention.

Subsequently, referring to FIG. 3A, a first type doped semiconductor layer 122, a light emitting layer 124, and a second type doped semiconductor layer 126 are formed on the template substrate 110 in sequence. Overall, the first type doped semiconductor layer 122, the light emitting layer 124, and the second type doped semiconductor layer 126 can be called collectively as an epitaxy layer 120. The first type doped semiconductor layer 122 and the second type doped semiconductor layer 126 are an n-type semiconductor layer and a p-type semiconductor layer respectively. In one embodiment of the present invention, the step for forming the first type doped semiconductor layer 122 on the template substrate 110 includes: forming a first contact layer 122a on the template substrate 110, and then forming a first cladding layer 122b on the first contact layer 122a. The first contact layer 122a is formed to enable the subsequent epitaxy process to be more convenient and easier. Additionally, when the template substrate 110 is later removed by means of a wet etching process, the contact layer 122a serves as an etching stop layer. The light emitting layer 124 is the part mainly used to generate light in an LED. In one embodiment of the present invention, the light emitting layer 124 can be a Multiple Quantum Well (MQW) structure. Additionally, the step for forming the second type doped semiconductor layer 126 includes: forming a second cladding layer 126a on the light emitting layer 124, and then forming a second contact layer 126b on the second cladding layer 126a. The above epitaxy layer 120 can be a binary compound semiconductor, such as GaN, GaAs, and InN, a ternary compound semiconductor, such as AlGaAs, or a quaternary compound semiconductor, such as ALGaInP. The material of the epitaxy layer 120 is not limited in the present invention.

Figure 3B:
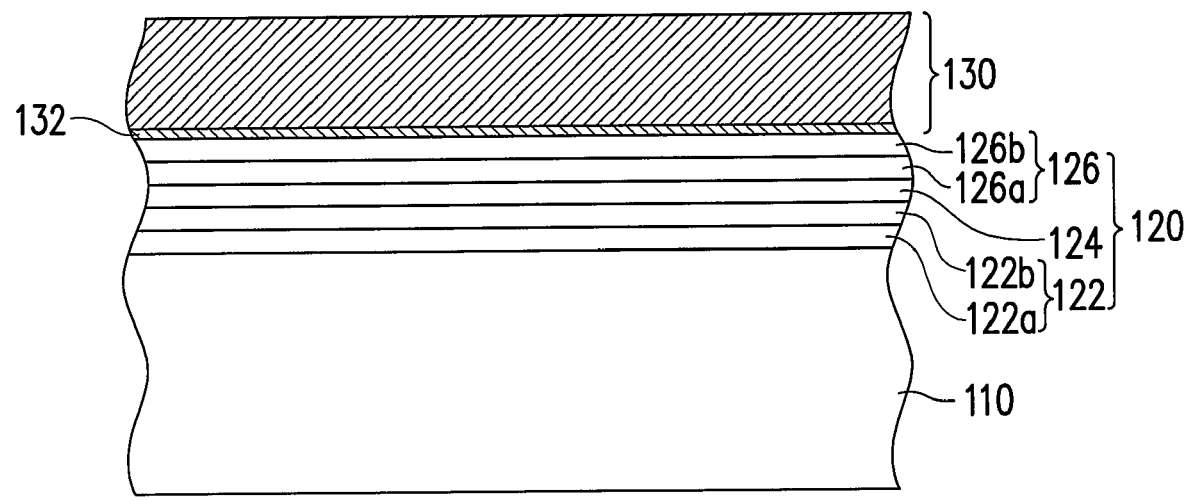

Next, referring to FIG. 3B, a metal layer 130 is formed on the second type doped semiconductor layer 126. In one embodiment of the present invention, the material of the metal layer 130 is selected from among those with high reflectivity and a high heat conductivity coefficient, such as one selected from a group consisting of copper, nickel, gold, palladium, platinum, and all alloys thereof, to improve the light reflection effect, thereby enhancing the front light emitting efficiency of the LED, and improving the heat dissipation effect. Additionally, a thick metal film can be formed on the second type doped semiconductor layer 126 through plating process, such as evaporation, sputtering, electroplating, or electroless-plating, wherein the thick metal film serves as the metal layer 130. When the metal layer 130 is formed by means of electroplating, an electroplating seed layer 132 is first formed on the second type doped semiconductor layer 126, wherein the material of the electroplating seed layer 132 can be Au, such that the metal layer 130 is easily grown on the second type doped semiconductor layer 126.

Figure 3C:
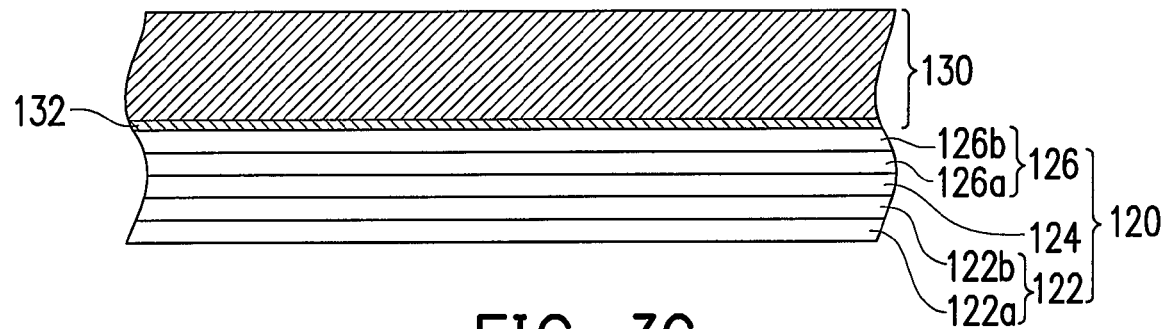

Subsequently, referring to FIG. 3C, the template substrate 110 is removed. In this step, the template substrate 110 can be removed through a dry etching process, wet etching process, a polishing process, or lift-off process. Besides, the template substrate 110 can be grinded and then be polished, thus removing the template substrate 110. When the template substrate 110 is removed through a wet etching process, the contact layer 122a serves as an etching stop layer, to prevent the etching solution from etching the epitaxy layer 120. The thickness of the whole epitaxy layer 120 can be reduced to 10 μm.

Figure 3D:
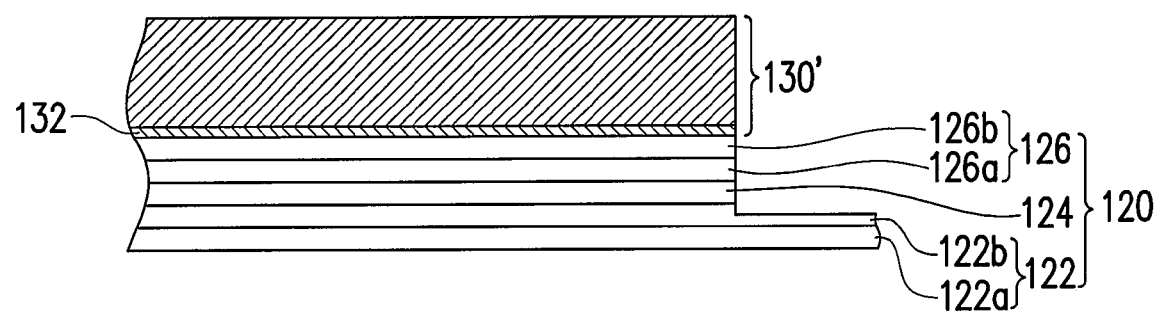

Next, referring to FIG. 3D, portions of the metal layer 130, the second type doped semiconductor layer 126, and the light emitting layer 124 are removed to expose a portion of the first type doped semiconductor layer 122, wherein the remaining metal layer 130 forms a conductive supporting layer 130' to support the epitaxy layer 120. In one embodiment of the present invention, a part of the metal layer 130, the second type doped semiconductor layer 126, and the light emitting layer 124 is removed through a dry etching process or a wet etching process. Additionally, in this step, after portions of the metal layer 130, the second type doped semiconductor layer 126, and the light emitting layer 124 are removed, a portion of the first type doped semiconductor layer 122 is further removed to expose a portion of the first type doped semiconductor layer 122. Similarly, a portion of the first type doped semiconductor layer 122 can be removed through a dry etching process or a wet etching process.

Figure 3E:
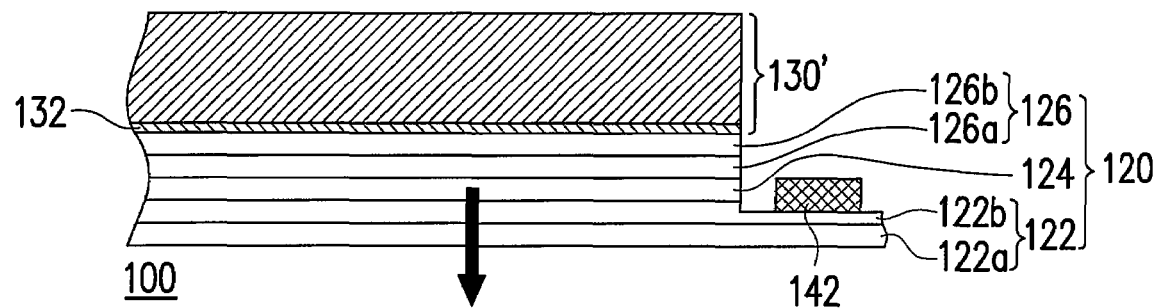

Finally, referring to FIG. 3E, a first contact pad 142 is formed on the exposed first type doped semiconductor layer 122, wherein the first contact pad 142 is electrically connected to the first type doped semiconductor layer 122. As such, the fabrication of the substrate-free LED 100 is complete. In the substrate-free LED 100, the first contact pad 142 serves as an n-type ohmic contact electrode, and the conductive supporting layer 130' directly serves as a p-type ohmic contact electrode. After the completion of the fabrication process, the obtained substrate-free LED 100 has a minimum thickness between 11 μm and 120 μm. The light emitting direction of the fabricated substrate-free LED 100 is shown by the black arrow in FIG. 3E. It can be seen clearly from FIG. 3 that no electrodes are disposed on the light emitting surface of the whole LED 100, thereby greatly improving the light emitting efficiency thereof.

Figure 3F:
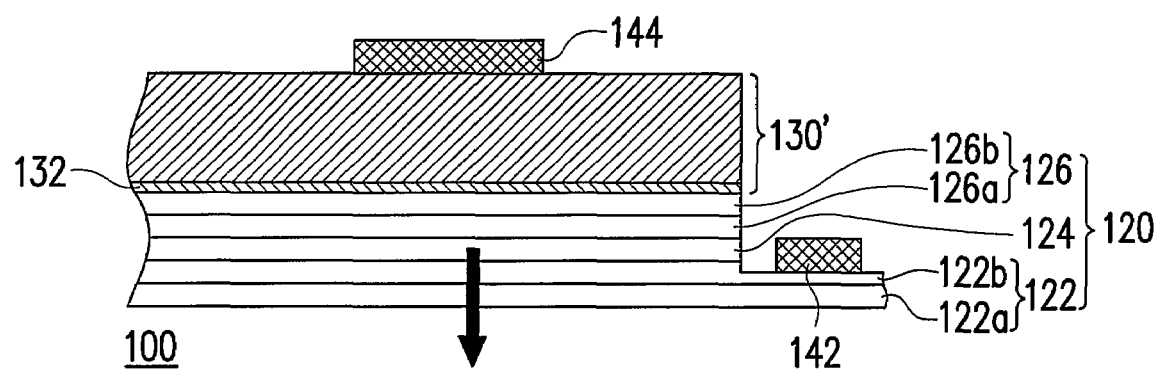

Additionally, referring to FIG. 3F, when the fabrication of the substrate-free LED 100 is complete, a second contact pad 144 is optionally formed on the conductive supporting layer 130' to serve as the p-type ohmic contact electrode of the substrate-free LED 100.

Referring to FIG. 3E, the substrate-free LED 100 of the present invention mainly comprises a first type doped semiconductor layer 122, a light emitting layer 124, a second type doped semiconductor layer 126, a conductive supporting layer 130' and a first contact pad 142. In one embodiment of the present invention, the first type doped semiconductor layer 122 and the second type doped semiconductor layer 126 are an n-type semiconductor layer and a p-type semiconductor layer respectively. The first type doped semiconductor layer 122 is composed of, for example, the first contact layer 122a and the first cladding layer 122b disposed thereon. The light emitting layer 124 is disposed on the first type doped semiconductor layer 122 and exposes a part of the first type doped semiconductor layer 122. Additionally, the light emitting layer 124 may be composed of a Multiple Quantum Well (MQW) structure. The second type doped semiconductor layer 126 is disposed on the light emitting layer 124. In one embodiment of the present invention, the second type doped semiconductor layer 126 is composed of, for example, the second cladding layer 126a and the second contact layer 126b, wherein the second cladding layer 126a is disposed on the light emitting layer 124, and the second contact layer 126b is disposed on the second cladding layer 126a. The conductive supporting layer 130' is disposed on the second type doped semiconductor layer 126; the material of the conductive supporting layer 130' is selected from a group consisting of copper, nickel, gold, palladium, platinum, and all alloys thereof. The first contact pad 142 is disposed on the first type doped semiconductor layer 122 exposed by the light emitting layer 124 and electrically connected to the first type doped semiconductor layer 122. In the substrate-free LED 100, the first contact pad 142 serves as an n-type ohmic contact electrode; and the conductive supporting layer 130' directly serves as a p-type ohmic contact electrode.

Additionally, referring to FIG. 3F, the substrate-free LED 100 further comprises a second contact pad 144 disposed on the conductive supporting layer 130', wherein the second contact pad 144 is electrically connected to the conductive supporting layer 130', so as to serve as the p-type ohmic contact electrode.

In view of the above, the LED provided by the present invention has the following advantages:

(1) In the substrate-free LED of the present invention, the first contact pad and the conductive supporting layer that serves as an electrode (or the second contact pad) are both disposed on the same side of the epitaxy layer, such that the light shielding effect of the electrode can be avoided, so as to improve the front light emitting efficiency of the LED.

(2) In the present invention, after the epitaxy layer formed on the template substrate has been combined with the thick metal film, the template substrate is removed, such that the epitaxy layer is supported by the thick metal film. Since the metal has favorable ductility, the fabricated substrate-free LED is flexible, and can be applied in flexible displays.

(3) In the substrate-free LED of the present invention, the epitaxy layer is supported by the thick metal film. Since the metal has preferable reflexivity and heat dissipation properties, the light emitting efficiency of the LED is improved, and the problem of heat dissipation when the LED is combined with a large size substrate is also improved.

(4) As compared with the conventional LED with the minimum overall thickness between 120 μm and 200 μm, the minimum thickness of the substrate-free LED of the present invention can be reduced to about 11 μm, thus meets the requirements of miniaturization demanded by electronic products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a substrate-free light emitting diode (LED), comprising:
   providing a template substrate;
   forming an epitaxy layer on the template substrate, wherein the epitaxy layer includes a first type doped semiconductor layer, a light emitting layer and a second type doped semiconductor layer sequentially stacked thereon;
   forming a metal layer on the epitaxy layer;
   removing the template substrate;
   removing portions of the metal layer, the second type doped semiconductor layer, and the light emitting layer to expose a part of the first type doped semiconductor layer, wherein the remaining metal layer forms a conductive supporting layer; and
   forming a first contact pad on the exposed first type doped semiconductor layer after the template substrate is removed, wherein the first contact pad is electrically connected to the first type doped semiconductor layer.

2. The method for fabricating a substrate-free LED as claimed in claim 1, wherein a material of the template substrate comprises silicon, glass, GaAs, GaN, AlGaAs, GaP, SiC, InP, BN, $Al_2O_3$, sapphire or AlN.

3. The method for fabricating a substrate-free LED as claimed in claim 1, wherein the step for forming the first type doped semiconductor layer on the template substrate includes:
   forming a first contact layer on the template substrate; and
   forming a first cladding layer on the first contact layer.

4. The method for fabricating a substrate-free LED as claimed in claim 1, wherein the light emitting layer includes a Multiple Quantum Well (MQW) structure.

5. The method for fabricating a substrate-free LED as claimed in claim 1, wherein the step for forming the second type doped semiconductor layer includes:
   forming a second cladding layer on the light emitting layer; and
   forming a second contact layer on the second cladding layer.

6. The method for fabricating a substrate-free LED as claimed in claim 1, wherein the first type doped semiconductor layer and the second type doped semiconductor layer are an n-type semiconductor layer and a p-type semiconductor layer respectively.

7. The method for fabricating a substrate-free LED as claimed in claim 1, wherein the metal layer is formed through a plating process.

8. The method for fabricating a substrate-free LED as claimed in claim 7, wherein the plating process includes evaporation, sputtering, electroplating, or electroless-plating.

9. The method for fabricating a substrate-free LED as claimed in claim 8, wherein when the metal layer is formed by means of an electroplating process, an electroplating seed layer is first formed on the second type doped semiconductor layer, and then the metal layer is formed by means of the electroplating process.

10. The method for fabricating a substrate-free LED as claimed in claim 1, wherein the process of removing the template substrate includes a dry etching process, a wet etching process, a polishing process, or a lift-off process.

11. The method for fabricating a substrate-free LED as claimed in claim 1, wherein the process of removing the template substrate includes grinding and then polishing the template substrate.

12. The method for fabricating a substrate-free LED as claimed in claim 1, wherein the process of removing portions of the metal layer, the second type doped semiconductor layer and the light emitting layer includes a dry etching process or a wet etching process.

13. The method for fabricating a substrate-free LED as claimed in claim 1, wherein the step for removing portions of the metal layer, the second type doped semiconductor layer, and the light emitting layer further comprises a step of removing a part of the first type doped semiconductor layer to expose a part of the first type doped semiconductor layer.

14. The method for fabricating a substrate-free LED as claimed in claim 13, wherein the process of removing portions of the metal layer, the second type doped semiconductor layer, the light emitting layer, and the first type doped semiconductor layer includes a dry etching process or a wet etching process.

15. The method for fabricating a substrate-free LED as claimed in claim 1, further comprising a step of forming a second contact pad on the conductive supporting layer, wherein the second contact pad is electrically connected to the conductive supporting layer.

* * * * *